(12) United States Patent
Kawai et al.

(10) Patent No.: US 8,728,923 B2
(45) Date of Patent: *May 20, 2014

(54) MANUFACTURING METHOD OF SEMICONDUCTOR DEVICE

(71) Applicant: DENSO CORPORATION, Kariya (JP)

(72) Inventors: Jun Kawai, Anjo (JP); Tetsuji Kondou, Nagoya (JP); Kazuhiko Sugiura, Nagoya (JP); Nobuyuki Kato, Nisshin (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/626,072

(22) Filed: Sep. 25, 2012

(65) Prior Publication Data

US 2013/0102127 A1   Apr. 25, 2013

(30) Foreign Application Priority Data

Sep. 29, 2011   (JP) ................................ 2011-214899

(51) Int. Cl.
H01L 21/04 (2006.01)
H01L 29/66 (2006.01)
H01L 29/78 (2006.01)
H01L 21/268 (2006.01)
H01L 21/683 (2006.01)

(52) U.S. Cl.
USPC ........... 438/571; 438/463; 438/597; 438/602; 438/586; 257/E29.143; 257/E29.104; 257/E21.054; 257/E21.062; 257/E21.382

(58) Field of Classification Search
CPC .............. H01L 29/6659; H01L 29/66651; H01L 29/66666; H01L 39/2458; H01L 21/0445; H01L 21/2015; H01L 21/02675; H01L 21/28176; H01L 29/66878; H01L 21/0485; H01L 21/0272; H01L 29/7828; H01L 21/268; H01L 21/8213
USPC .......... 438/463, 917, 482, 602, 455; 257/376, 257/E31.023, E31.046, E29.104, E21.054, 257/E21.182, E21.321, E21.605, E21.062, 257/E21.09, E29.003, E21.066
See application file for complete search history.

(56) References Cited

U.S. PATENT DOCUMENTS

| | | | | |
|---|---|---|---|---|
| 6,194,290 | B1 * | 2/2001 | Kub et al. | 438/455 |
| 8,216,929 | B2 * | 7/2012 | Kawai et al. | 438/602 |
| 8,440,524 | B2 * | 5/2013 | Fujiwara et al. | 438/253 |
| 8,450,196 | B2 * | 5/2013 | Rupp et al. | 438/572 |
| 8,492,248 | B2 * | 7/2013 | Tanaka | 438/473 |
| 2002/0175383 | A1 * | 11/2002 | Kocon et al. | 257/376 |
| 2005/0170572 | A1 * | 8/2005 | Hongo et al. | 438/166 |
| 2005/0230686 | A1 * | 10/2005 | Kojima et al. | 257/77 |

(Continued)

FOREIGN PATENT DOCUMENTS

JP   A-2008-135611   6/2008
JP   A-2009-54718   3/2009

*Primary Examiner* — Jarrett Stark
*Assistant Examiner* — Bitew Dinke
(74) *Attorney, Agent, or Firm* — Posz Law Group, PLC

(57) ABSTRACT

A manufacturing method of a semiconductor device having an ohmic electrode is disclosed. The manufacturing method includes: forming a metal thin film on a rear surface of a semiconductor substrate; forming an ohmic electrode by laser annealing by irradiating the metal thin film with laser beam; and dicing the semiconductor substrate into chips by cutting at a dicing region of the semiconductor substrate. In forming the ohmic electrode, laser irradiation of the metal thin film is performed on a chip-by-chip basis while the dicing region is not being irradiated with the laser beam.

2 Claims, 4 Drawing Sheets

(56) References Cited

U.S. PATENT DOCUMENTS

| | | |
|---|---|---|
| 2005/0272228 A1 | 12/2005 | Ito et al. |
| 2007/0066039 A1* | 3/2007 | Agarwal et al. ............... 438/534 |
| 2007/0235745 A1* | 10/2007 | Hayashi et al. ................. 257/94 |
| 2008/0258183 A1* | 10/2008 | Rupp et al. .................... 257/256 |
| 2008/0318400 A1* | 12/2008 | Nakamura .................... 438/522 |
| 2009/0117716 A1* | 5/2009 | Shimomura et al. .......... 438/487 |
| 2011/0115033 A1* | 5/2011 | Tamaki et al. ................. 257/409 |
| 2011/0272711 A1* | 11/2011 | Okano ............................ 257/77 |
| 2011/0284957 A1* | 11/2011 | Tamaki et al. ................. 257/339 |
| 2011/0306188 A1* | 12/2011 | Kawai et al. ................... 438/482 |
| 2012/0007104 A1* | 1/2012 | Wada et al. ..................... 257/77 |
| 2012/0009695 A1* | 1/2012 | Amada et al. ................... 438/17 |
| 2012/0164765 A1* | 6/2012 | Slater et al. ..................... 438/22 |

* cited by examiner

MANUFACTURING METHOD OF SEMICONDUCTOR DEVICE

CROSS REFERENCE TO RELATED APPLICATION

The present application is based on Japanese Patent Application No. 2011-214899 filed on Sep. 29, 2011, disclosure of which is incorporated herein by reference.

TECHNICAL FIELD

The present disclosure relates to a manufacturing method of a semiconductor device having an ohmic electrode. It may be preferable to apply the manufacturing method to, in particular, a manufacturing method of a silicon carbide (referred hereinafter to as SiC) semiconductor device, which uses SiC as a semiconductor material.

BACKGROUND

In forming a vertical type power device in a SiC substrate, it is desirable to thin the device and form a drain electrode in order to reduce a resistance in a thickness direction of the substrate. In forming the drain electrode, an ohmic electrode is formed to reduce a contact resistance between the SiC substrate and the drain electrode. Laser annealing can be applied to a method of making drain electrode as an ohmic electrode (see, for example, Patent Documents 1, 2)

Patent Document 1: JP-2008-135611A
Patent Document 2: JP-2009-509339A (corresponding to US 20070066039A)

In making a drain electrode as an ohmic electrode by laser annealing, a beam diameter of laser beam is smaller than an area of the drain electrode. For example, size of the drain electrode is 5 mm while the beam diameter of laser beam is 200 μm. Therefore, it may be necessary to move and scan the laser beam on an x-y plane, so that all the area of the drain electrode is irradiated with the laser beam. It is confirmed that when the SiC substrate is diced and divided into chips after the laser annealing, the chips break, that is, a chipping occurs.

SUMMARY

In view of the foregoing, it is an object of the present disclosure to minimize an occurrence of chipping when an ohmic electrode is formed by laser annealing.

According to a study on minimization of chipping by the inventors of the present application, it is revealed that the chipping can be caused by streaky-shaped laser traces produced in the laser annealing (or a convex portion between the laser traces). According to a study on prototypes by the inventors of the present application, it is revealed that the chipping can easily occur when a dicing direction is substantially parallel to the scan direction, that is, when the dicing direction is substantially parallel to a longitudinal direction of the laser trade.

According to a first example of the present disclosure, there is provided a manufacturing method of a semiconductor device that includes a semiconductor substrate made of a single crystal and having a principal surface and a rear surface opposite to the principal surface, a first electrode provided as an ohmic electrode arranged on the rear surface of the semiconductor substrate, and a second electrode arranged on the principal surface of the semiconductor substrate, the manufacturing method including: preparing a semiconductor substrate made of a single crystal and having a principal surface and a rear surface opposite to the principal surface; forming a metal thin film on the rear surface of the semiconductor substrate; after forming the metal thin film, forming an ohmic electrode as a first electrode by laser annealing, wherein the laser annealing includes irradiating the metal thin film with laser beam; and after forming the first electrode, dicing the semiconductor substrate into chips by cutting at a dicing region of the semiconductor substrate, wherein: in forming the first electrode, laser irradiation of the metal thin film is performed on a chip-by-chip basis while the dicing region is not being irradiated with the laser beam.

According to the above manufacturing method, when the first electrode is formed on the rear surface of the semiconductor substrate, the laser annealing is performed only within the chip and is not performed in the dicing region. Therefore, when the dicing is preformed, the region where the laser trace is absent is cut. Because of this, it is possible to perform the dicing with no influence of the laser trace and it is possible to minimize the occurrence of chipping.

According to a second example, there is provided a manufacturing method of a semiconductor device that includes a semiconductor substrate made of a single crystal and having a principal surface and a rear surface opposite to the principal surface, a first electrode provided as an ohmic electrode arranged on the rear surface of the semiconductor substrate, and a second electrode arranged on the principal surface of the semiconductor substrate, the manufacturing method including: preparing a semiconductor substrate made of a single crystal and having a principal surface and a rear surface opposite to the principal surface; forming a metal thin film on the rear surface of the semiconductor substrate; after forming the metal thin film, forming an ohmic electrode as a first electrode by laser annealing, wherein the laser annealing includes irradiating the metal thin film with laser beam; and after forming the first electrode, dicing the semiconductor substrate into chips by cutting at a dicing region of the semiconductor substrate, wherein: in forming the first electrode, laser irradiation of the metal thin film is performed while being inclined with respect to a dicing direction of the dicing; and the dicing is performed across a laser trace produced in the laser irradiation.

According to the above manufacturing method, the laser annealing is inclined with respect to the dicing direction. Because of this, it is possible to make a difference between the dicing direction and a longitudinal direction of the laser trace, and it is possible to performing the dicing across the laser trace. Therefore, the chipping, which pan occur when the dicing direction is substantially parallel to the laser race, can be prevented from occurring.

According to a third example, there is provided a manufacturing method of a semiconductor device that includes a semiconductor substrate made of a single crystal and having a principal surface and a rear surface opposite to the principal surface, a first electrode provided as an ohmic electrode arranged on the rear surface of the semiconductor substrate, and a second electrode arranged on the principal surface of the semiconductor substrate, the manufacturing method including: preparing a semiconductor substrate made of a single crystal and having a principal surface and a rear surface opposite to the principal surface; forming a metal thin film on the rear surface of the semiconductor substrate; after forming the metal thin film, forming an ohmic electrode as a first electrode by laser annealing, wherein the laser annealing includes irradiating the metal thin film with laser beam; and after forming the first electrode, dicing the semiconductor substrate into chips by cutting at a dicing region of the semiconductor substrate, wherein: in forming the first electrode, the metal thin film is irradiated with the laser beam in at least two non-parallel directions to form multiple laser traces intersecting with each other within each chip, and thereafter, a convex portion remaining in an area with no laser trace is cut.

According to the above manufacturing method, the convex portion remaining in the area having no laser trace is cut. Therefore, the chipping, which can occur when, in only one direction, the dicing direction is substantially parallel to the laser trace, can be prevented from occurring. In this way also it is possible to perform the dicing with no influence of the laser trace, and it is possible to minimize the occurrence of chipping.

According to a fourth aspect, there is provided a manufacturing method of a semiconductor device that includes a semiconductor substrate made of a single crystal and having a principal surface and a rear surface opposite to the principal surface, a first electrode provided as an ohmic electrode arranged on the rear surface of the semiconductor substrate, and a second electrode arranged on the principal surface of the semiconductor substrate, the manufacturing method including: preparing a semiconductor substrate made of a single crystal and having a principal surface and a rear surface opposite to the principal surface; forming a metal thin film on the rear surface of the semiconductor substrate; after forming the metal thin film, forming an ohmic electrode as a first electrode by laser annealing, wherein the laser annealing includes irradiating the metal thin film with laser beam; and after forming the first electrode, dicing the semiconductor substrate into chips by cutting at a dicing region of the semiconductor substrate, wherein: a dicing tape is attached before the dicing, wherein thickness of an adhesive layer of the dicing tape is larger than a level difference between a concave portion in which a laser trace produced in the laser irradiation is formed and a convex portion in which the laser trace is not formed.

By attaching the dicing tape in the above way, the concave and convex portions formed by the presence and absence of the laser trace can be filled with the adhesive layer. By performing the dicing in this state, it is possible to perform the dicing with no influence of the later trace, and it is possible to minimize the occurrence of chipping.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
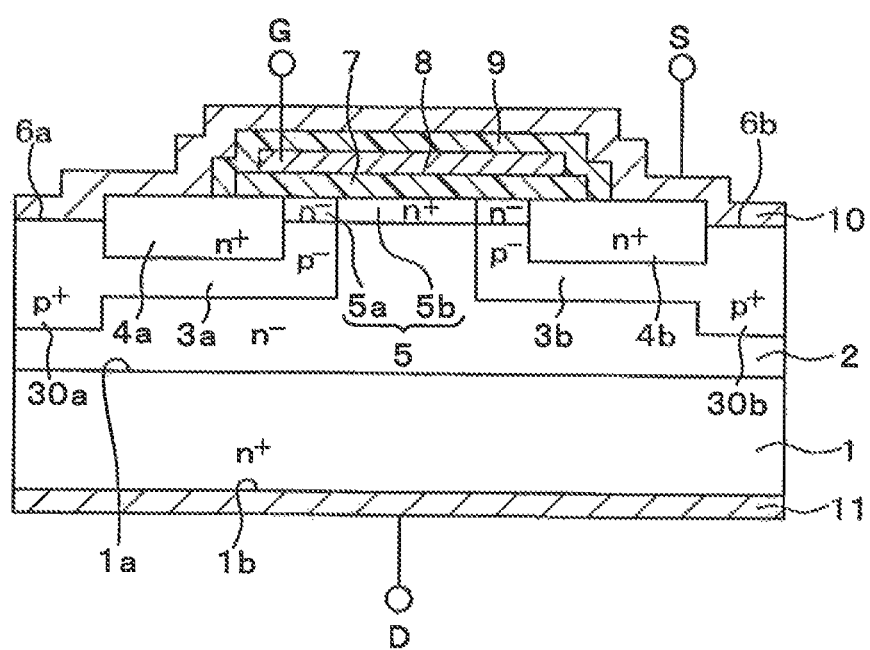
FIG. 1 is a sectional view of a vertical type power MOSFET that is manufactured by an SiC semiconductor device manufacturing method of a first embodiment.

Embodiments of the present disclosure will be described based on the drawings. In the drawings, like references are used to refer to like or equivalent parts between the below embodiments.

First Embodiment

An embodiment of the present disclosure illustrated in the drawings will be described. FIG. 1 is a sectional view of a planer MOSFET (vertical type MOSFET) manufactured by a SiC semiconductor device manufacturing method of the present embodiment. This device is preferably applicable to an inverter. Based on FIG. 1, a structure of a vertical type power MOSFET will be illustrated.

The vertical type power MOSFET is formed by using an $n^+$-type semiconductor substrate 1 (hereinafter, referred to as $n^+$-type substrate). The $n^+$-type substrate has a thickness of 350 µm, has an upper surface as a principal surface $1a$, has a lower surface as a rear surface $1b$ opposite to the principal surface $1a$, and is made of a single crystal SiC. An $n^-$-type epitaxial layer (also referred to as an $n^-$-type epi-layer) made of SiC with a dopant concentration smaller than the $n^+$-type substrate is layered on the principal surface $1a$ of the $n^+$-type substrate 1.

A $p^-$-type base region $3a$ and a $p^-$-type base region $3b$ (also referred to as $p^-$-type base regions $3a$, $3b$), which have predetermined depths and are spaced apart from each other, are formed in predetermined regions of surface parts of the $n^-$-type epi-layer 2. Deep base layers $30a$, $30b$ having larger thicknesses are formed in portions of the $p^-$-type base regions $3a$, $3b$. The deep base layers $30a$, $30b$ are formed so as not to be placed blow the $n^+$-type source regions $4a$, $4b$. The thicker portions of the $p^-$-type base regions $3a$, $3b$, in which the deep base layers $30a$, $30b$ are formed, has larger impurity concentrations than thinner portions of the $p^-$-type base regions $3a$, $3b$, in which the deep base regions $30a$, $30b$ are not formed.

Because of these deep base layers $30a$, $30b$, thicknesses of the $n^-$-type epi-layer 2 blow the deep base layers $30a$, $30b$ can be reduced (a distance between the $n^+$-type semiconductor substrate $n^+$-type substrate 1 and the deep base layer $30a$, $30b$) and an electric field strength can be increased, and an occurrence of avalanche breakdown is facilitated.

An $n^+$-type source region $4a$ shallower than the $n^-$-type base region $3a$ is formed on a predetermined region of a surface part of the $p^-$-type base region $3a$. An $n^+$-type source region $4b$ shallower than the $p^-$-type base region $3b$ is formed on a predetermined region of a surface part of the $p^-$-type base region $3b$.

An n-type SiC layer 5 including an $n^-$-type layer $5a$ and an $n^+$-type layer $5b$ is arranged to extend on a surface of the $n^-$-type epi-layer 2 between the $n^+$-type source region $4a$ and the $n^+$-type source region $4b$ and on surfaces of the $p^-$-type base regions $3a$, $3b$. Specifically, the n-type SiC layer 5 is arranged to connect the $n^-$-type epi-layer 2 to the $n^+$-type source regions $4a$, $4b$ at the surfaces of the pr-type base regions $3a$, $3b$. This n-type SiC layer 5 functions as a channel formation layer in a device surface when the device is in operation. In the following, the n-type SiC layer 5 is also referred to as a surface channel layer.

The surface channel layer 5 is formed by, for example, ion-implantation of n-type impurities into surface parts of the n⁻-type epi-layer 2 and the p⁻-type base regions 3a, 3b. The n⁻-type layer 5a of the surface channel layer 5 is arranged above the p⁻-type base region 3a, 3b and has a low dopant concentration of approximately $1\times10^{15}$ cm$^{-3}$ to $1\times10^{17}$ cm$^{-3}$. The dopant concentration of the n⁻-type layer 5a is less than or equal to that of the n⁻-type epi-layer 2 and that of the p⁻-type base regions 3a, 3b. The n⁺-type layer 5b, which is formed on the surface of the n⁻-type epi-layer 2, has a larger dopant concentration than the n⁻-type epi-layer 2. Because of the above, a low on-resistance is provided.

Depressed portions 6a, 6b are formed on a surface that is made up of the surfaces of the p⁻-type base regions 3a, 3b and the surfaces of the n⁺-type source regions 4a, 4b. The deep base layers 30a, 30b, which have large p-type impurity concentrations, are exposed from bottoms of the depressed portions 6a, 6b.

A gate insulating film 7 (silicon oxide film) is formed on a upper surface of the surface channel layer 5 and upper surfaces of the n⁺-type source regions 4a, 4b. A gate electrode 8 is formed above the gate insulating film 7 and is covered with an insulating film 9. A silicon oxide film may be used as the insulating film 9, above which a source electrode 10 is formed. The source electrode 10 is in contact with the n⁺-type source regions 4a, 4b and the p⁻-type base regions 3a, 3b. A drain electrode 11 is formed on the rear surface 1b of the n⁺-type substrate 1. This drain electrode 11 is provided as an ohmic electrode having an ohmic contact with the rear surface 1b of the n⁺-type substrate 1.

In the above structure, the source electrode 10 corresponds to a second electrode, and a drain electrode 11 corresponds to a first electrode.

Next, a manufacturing method of the vertical type power MOSFET illustrated in FIG. 1 will be described. Since the manufacturing method of the vertical type power MOSFET of the present embodiment can include conventional processes, a formation method of a drain electrode 11 distinct from a conventional one will be mainly described.

FIG. 2 illustrates a process of forming a drain electrode of the vertical type power MOSFET illustrated in FIG. 1. In FIG. 2, illustration of an element structure of the vertical type power MOSFET is omitted for simplification.

Figure 2A:
FIGS. 2A to 2D are diagrams illustrating manufacturing processes of a drain electrode of the vertical type power MOSFET illustrated in FIG. 1.

First, as shown in FIG. 2A, an certain object, in which a device portion on a front side of the n⁺-type substrate 1 illustrated in FIG. 1 has been formed, is prepared. In other words, in the prepared object, although the source electrode 10 has been formed, the drain electrode 11 has not been formed. Thereafter, the n⁺-type substrate 1 is thinned, so that the n⁺-type substrate 1 has a thickness of, for example, 350 μm.

Figure 2B:
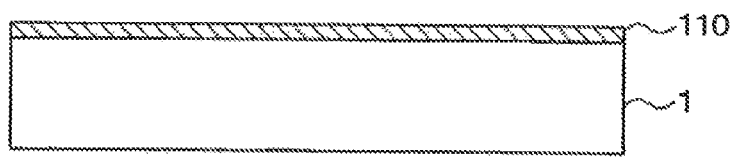

Next, in a process illustrated in FIG. 2B, a metal thin film 110 is formed on the rear surface 1b of the n⁺-type substrate 1 (metal thin film formation process). For example, by Ni deposition on the rear surface 1b of the n⁺-type substrate 1, the metal thin film 110 is formed on the rear surface 1b of the n⁻-type substrate 1.

Figure 2C:
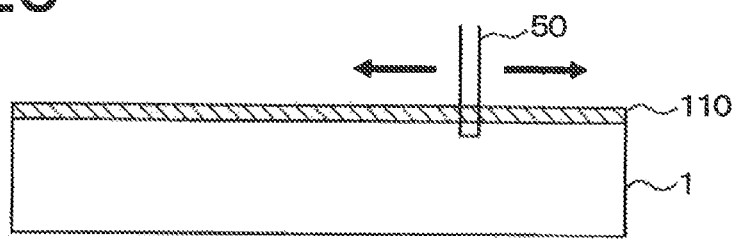
Figure 2D:
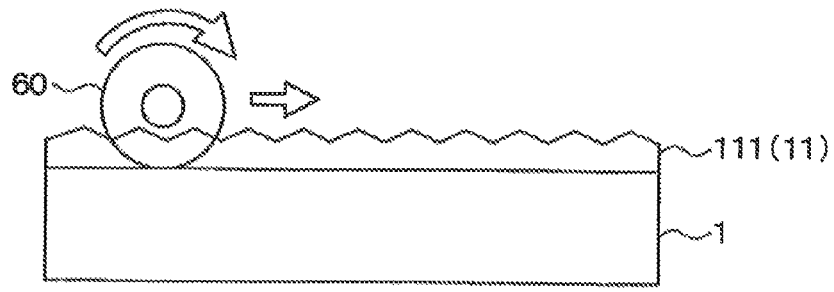

In a subsequent process illustrated in FIG. 2C, a laser annealing is performed by irradiating the metal thin film 110 with laser beam (electrode formation process). For example, by using a LD-pumped solid-state laser, a laser beam 50 scans the rear surface 1b of the n⁺-type substrate 1 on an X-Y plane, so that the laser irradiation is performed on a chip-by-chip basis and that a dicing region is not irradiated with the laser beam. This causes silicidation because of reaction of the metal (Ni in the present embodiment) of the metal thin film with Si of the n⁺-type substrate 1. As a result, an alloy layer 111 is formed, as shown in FIG. 2D. This alloy layer 11 constitutes the drain electrode 11 formed as the ohmic electrode. By performing a local annealing in the laser annealing, it is possible to make the drain electrode 11 as the ohmic electrode by a low-temperature process.

Thereafter, in a process illustrated in FIG. 2D, the n⁺-type substrate 1 is diced into chips by cutting at the dicing region of the n⁺-type substrate 1 with use of a dicing blade 60 (dicing process). Through the above manners, the SiC semiconductor device having the vertical type power MOSFET is manufactured.

Figure 3A:
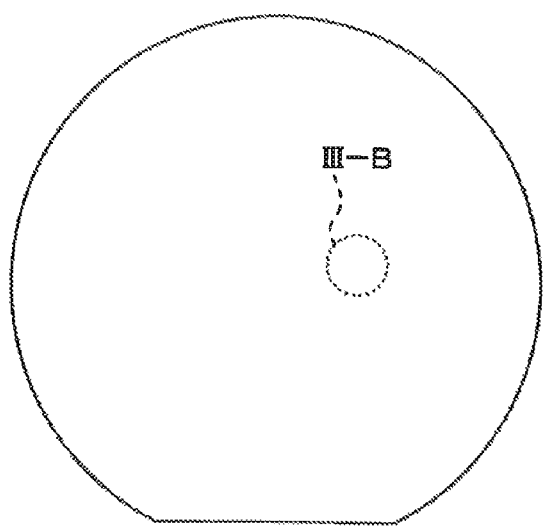
FIG. 3A is a general view illustrating an annealed $n^+$-type substrate 1 before dicing.
Figure 3B:
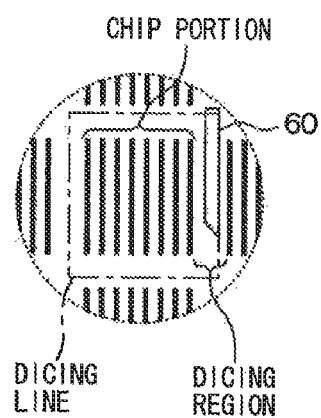
FIG. 3B is an enlarged view of an area III-B of FIG. 3A.

In the above manufacturing method of an SiC semiconductor device, in the process of FIG. 2D, the laser annealing is performed such that the laser irradiation is performed on a chip-by-chip basis while the dicing region is not being irradiated with the laser beam. Therefore, the annealing is performed as illustrated in FIG. 3, FIG. 3A is a general view of an annealed n⁺-type substrate 1 before the dicing. FIG. 3B is an enlarged view of an area III-B of FIG. 3A. FIG. 3B also illustrates a relation to a dicing line. The thick line in FIG. 3B denotes a laser trace produced in the laser annealing. As shown in this fig., since the laser irradiation is performed within each chip, the dicing region is free from the laser irradiation.

As described in the above, after the laser annealing is performed, the dicing is performed in a state where streaky-shaped laser traces are present. According to the study made by the inventors of the present application, it is revealed that an occurrence of chipping can be caused by the streaky-shaped laser traces, which have a concavo-convex shape made up of laser traces and un-scanned areas. According to the study on prototypes made by the inventors of the present application, it is revealed that when the dicing direction is substantially parallel to the scan direction, that is, when the dicing direction is substantially parallel to a longitudinal direction of the laser trace, the chipping can easily occur.

In view of the above, in the present embodiment, the laser trace is absent in the dicing region, in which the dicing blade 60 passes. Therefore, when the dicing is performed with use of the dicing blade 60, the area where the laser trace, does not remain is cut in the dicing. As a result, the dicing is performed without being influenced by the laser trace, and therefore, the occurrence of chipping can be minimized.

In the above-illustrated embodiment, when the drain electrode 11 is formed on the rear surface 1b of the n⁺-type substrate 1, the laser annealing is performed only inside the chip and is not performed in the dicing region. Thus, the dicing using the dicing blade 60 is performed at the place where the laser trace does not remain. As a result, it is possible to perform the dicing without the influence of the laser trace, and it is possible to minimize the occurrence of chipping.

Second Embodiment

A second embodiment will be illustrated. The present embodiment is a modification of the first embodiment with respect to a laser annealing manner, and the present embodiment can be substantially the same as the first embodiment with respect to other points. Thus, explanation is given on only points different from the first embodiment.

Figure 4A:
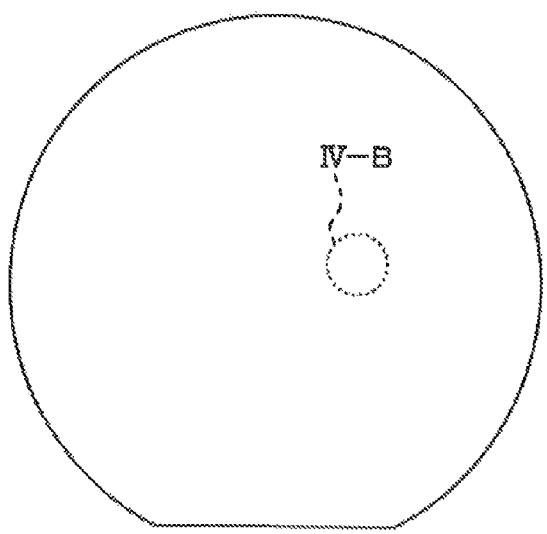
FIG. 4A is a general view illustrating an annealed $n^+$-type substrate 1 before dicing, when an SiC semiconductor device is manufactured by a manufacturing method of a second embodiment.
Figure 4B:
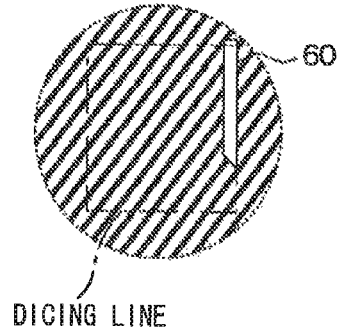
FIG. 4B is an enlarged view of an area IV-B of FIG. 4A.

FIG. 4A is a general view of an annealed n⁺-type substrate 1 before the dicing, when an SiC semiconductor device is manufactured by a manufacturing method of the present embodiment. FIG. 4B is an enlarged view of an area IV-B of FIG. 4A. FIG. 4B illustrates a relation to a dicing line. The thick line in FIG. 4B denotes a laser trace produced in the laser annealing. As shown in this fig., in the present embodiment, the laser annealing is inclined, with respect to the dicing direction of the dicing blade 60. Because of this, the dicing direction in the dicing is different from the longitudinal direction of the laser trace, and thus, the cutting is performed across the laser traces. Therefore, the chipping, which can occur when the directing direction is substantially parallel to the laser trace, is prevented from occurring. According to an experiment result, it is preferable to perform the laser irradiation with an inclination of from 15 degrees to 75 degrees with respect to the dicing direction. This manner also enables the dicing to be preformed with no influence of the laser trace and enables minimization of the occurrence of chipping.

Third Embodiment

A third embodiment will be illustrated. The present embodiment is a modification of the first embodiment with respect to a laser annealing manner, and the present embodiment can be substantially the same as the first embodiment with respect to other points. Thus, explanation is given on only points different from the first embodiment.

Figure 5A:
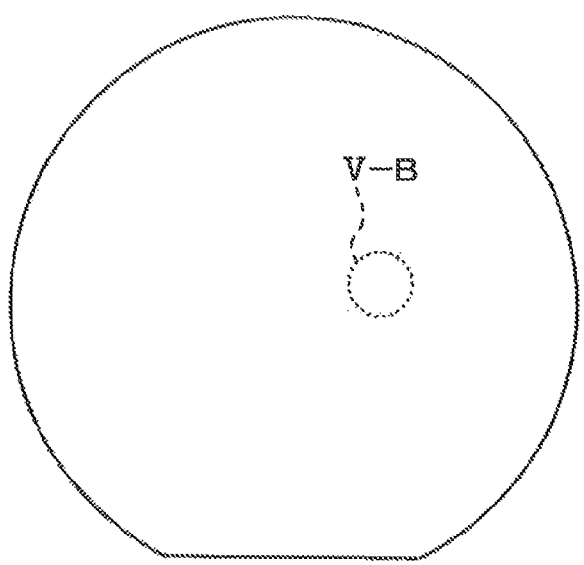
FIG. 5A is a general view illustrating an annealed $n^+$-type substrate 1 before dicing when an SiC semiconductor device is manufactured by a manufacturing method of a third embodiment.
Figure 5B:
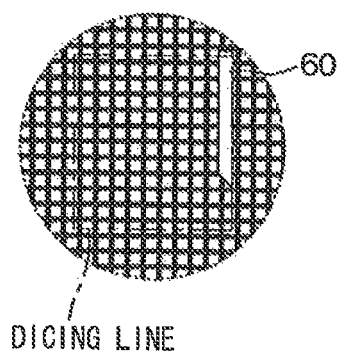
FIG. 5B is an enlarged view of an area V-B of FIG. 5A.

FIG. 5A is a general view of an annealed $n^+$-type substrate 1 before the dicing in manufacturing an SiC semiconductor device by a manufacturing method of the present embodiment. FIG. 5B is an enlarged view of a region V-B of FIG. 5A, FIG. 5B illustrates a relation to a dicing line. The thick line in FIG. 5B denotes a laser trace produced in the laser annealing. As shown in this fig., the laser annealing is performed in different angles by scanning in two directions. In the present embodiment, for example, the laser annealing is performed in two directions perpendicular to each other. A laser annealing interval is smaller than a chip interval, so that multiple laser traces intersecting with each other are present in each chip. By providing the chip with the multiple laser traces intersecting with each other in the chip, it is possible to perform the cutting at a convex portion having no laser trace. Therefore, the chipping, which can occur when the directing direction is substantially parallel to the laser trace in cases where the laser traces have only one longitudinal direction, is prevented from occurring. This manner also enables the dicing to be preformed with no influence of the laser trace and enables minimization of the occurrence of chipping.

A fourth embodiment will be illustrated. A difference of the present embodiment from the prior art includes a pre-process of the dicing after the laser annealing, whereas a difference of the first embodiment from the prior art includes the laser annealing manner. The present embodiment can be substantially the same as the first embodiment with respect to other points. Thus, explanation is given on only points different from the first embodiment.

Figure 6:
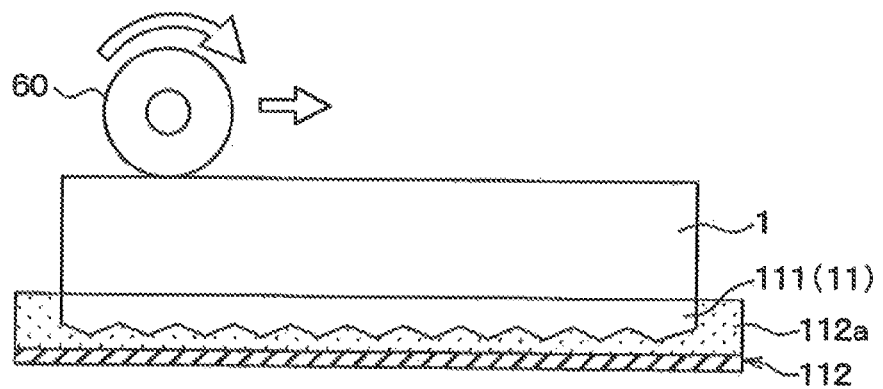
FIG. 6 is a sectional view illustrating dicing in manufacturing an SiC semiconductor device by a manufacturing method of a fourth embodiment.

FIG. 6 is a sectional view when the dicing is performed in manufacturing an SiC semiconductor device by a manufacturing method of the present embodiment. The process shown in this fig, is performed in place of the process of FIG. 20 illustrated in the first embodiment.

As shown in FIG. 6, before the dicing is a dicing tape 112 is attached to a surface of the alloy layer 111. The dicing tape 112 has an adhesive layer 112a which is thicker than a level difference (height difference) between a concave portion in which the laser trace is formed by the laser annealing and a convex portion in which the laser trace is not formed by the laser annealing. Therefore, in a state where the dicing tape 112 is attached, the concave and convex portions, which are formed by the presence and absence of the laser traces, are filled with the adhesive layer 112a. By performing the dicing in this state, it, is possible to perform the dicing with no influence of the laser traces, and it is possible to minimize the occurrence of chipping.

Other Embodiments

In each of the above embodiments, the laser annealing process that enables the dicing with the minimized influence of the laser trace is illustrated. However, the laser annealing based on a combination of the above embodiments may be performed. For example, while the dicing region is not being irradiated with the laser beam as illustrated in the first embodiment, the scanning direction may be inclined with respect to the dicing direction as illustrated in the second embodiment, and/or, the scanning may be performed in non-parallel two directions as illustrated in the third embodiment, and/or, the dicing tape May be attached.

In the above embodiments, the vertical type power MOSFET is illustrated. However, this is merely an example. The manufacturing method of the present disclosure is applicable to an SiC semiconductor device having other vertical type elements such as a diode, an IBGT and the like. In the case of diode, an anode electrode and a cathode electrode can correspond to first and second electrodes. In the case of IGBT, a collector electrode and an emitter electrode can correspond to first and second electrodes. In the first embodiment, the dicing region is not irradiated with the laser beam and only an area of the drain electrode 11 of the vertical type power MOSFET is irradiated with the laser beam. In forming the diode or the IGBT as the vertical type element, only an area of the rear electrode (e.g., cathode electrode, collector electrode) is irradiated with the laser beam.

In the above embodiment, an SiC semiconductor device is described as an example of semiconductor device. However, the manufacturing method of the present disclosure is applicable to a semiconductor device made of other semiconductor materials such as silicon and the like.

(Aspects)

According to the present disclosure, a manufacturing method of a semiconductor device can be provided in various forms. For example, according to a first aspect, there is provided a manufacturing method of a semiconductor device that includes a semiconductor substrate made of a single crystal and having a principal surface and a rear surface opposite to the principal surface, a first electrode provided as an ohmic electrode arranged on the rear surface of the semiconductor substrate, and a second electrode arranged on the principal surface of the semiconductor substrate, the manufacturing method including: preparing a semiconductor substrate made of a single crystal and having a principal surface and a rear surface opposite to the principal surface; forming a metal thin film on the rear surface of the semiconductor substrate; after forming the metal thin film, forming an ohmic electrode as a first electrode by laser annealing, wherein the laser annealing includes irradiating the metal thin film with laser beam; and after forming the first electrode, dicing the semiconductor substrate into chips by cutting at a dicing region of the semiconductor substrate, wherein: in forming the first electrode, laser irradiation of the metal thin film is performed on a chip-by-chip basis while the dicing region is not being irradiated with the laser beam.

According to the above manufacturing method, when the first electrode is formed on the rear surface of the semiconductor substrate, the laser annealing is performed only within the chip and is not performed in the dicing region. Therefore, when the dicing is preformed, the region where the laser trace is absent is cut. Because of this, it is possible to perform the dicing with no influence of the laser trace and it is possible to minimize the occurrence of chipping.

For example, forming the metal thin film and forming the first electrode may be performed to form the first electrode of a vertical type device in the semiconductor substrate. In forming the first electrode, only a portion of the metal thin film is irradiated with the laser beam, wherein the portion of the metal thin film is a portion where the first electrode of the vertical type device is to be formed.

According to a second aspect, there is provided a manufacturing method of a semiconductor device that includes a semiconductor substrate made of a single crystal and having a principal surface and a rear surface opposite to the principal surface, a first electrode provided as an ohmic electrode arranged on the rear surface of the semiconductor substrate, and a second electrode arranged on the principal surface of the semiconductor substrate, the manufacturing method including: preparing a semiconductor substrate made of a single crystal and having a principal surface and a rear surface opposite to the principal surface; forming a metal thin film on the rear surface of the semiconductor substrate; after forming the metal thin film, forming an ohmic electrode as a first electrode by laser annealing, wherein the laser annealing includes irradiating the metal thin film with laser beam; and after forming the first electrode, dicing the semiconductor substrate into chips by cutting at a dicing region of the semiconductor substrate, wherein: in forming the first electrode, laser irradiation of the metal thin film is performed while being inclined with respect to a dicing direction of the dicing; and the dicing is performed across a laser trace produced in the laser irradiation.

According to the above manufacturing method, the laser annealing is inclined with respect to the dicing direction. Because of this, it is possible to make a difference between the dicing direction and a longitudinal direction of the laser trace, and it is possible to performing the dicing across the laser trace. Therefore, the chipping, which can occur when the dicing direction is substantially parallel to the laser trace, can be prevented from occurring.

For example, in forming the first electrode, the laser irradiation of the metal thin film may be performed while being inclined by 15 degrees to 75 degrees with respect to a dicing direction of the dicing.

According to a third aspect, there is provided a manufacturing method of a semiconductor device that includes a semiconductor substrate made of a single crystal and having a principal surface and a rear surface opposite to the principal surface, a first electrode provided as an ohmic electrode arranged on the rear surface of the semiconductor substrate, and a second electrode arranged on the principal surface of the semiconductor substrate, the manufacturing method including; preparing a semiconductor substrate made of a single crystal and having a principal surface and a rear surface opposite to the principal surface; forming a metal thin film on the rear surface of the semiconductor substrate; after forming the metal thin film, forming an ohmic electrode as a first electrode by laser annealing, wherein the laser annealing includes irradiating the metal thin film with laser beam; and after forming the first electrode, dicing the semiconductor substrate into chips by cutting at a dicing region of the semiconductor substrate, wherein: the metal thin film is irradiated with the laser beam in at least two non-parallel directions to form multiple laser traces intersecting with, each other within each chip in forming the first electrode, and thereafter, a convex portion remaining in an area having no laser trace is cut.

According to the above manufacturing method, the convex portion remaining in the area having no laser trace is cut. Therefore, the chipping, which can occur when, in only one direction, the dicing direction is substantially parallel to the laser trace, can be prevented from occurring. In this way also, it is possible to perform the dicing with no influence of the laser trace, and it is possible to minimize the occurrence of chipping.

According to a fourth aspect, there is provided a manufacturing method of a semiconductor device that includes a semiconductor substrate made of a single crystal and having a principal surface and a rear surface opposite to the principal surface, a first electrode provided as an ohmic electrode arranged on the rear surface of the semiconductor substrate, and a second electrode arranged on the principal surface of the semiconductor substrate, the manufacturing method including: preparing a semiconductor substrate made of a single crystal and having a principal surface and a rear surface opposite to the principal surface; forming a metal thin film on the rear surface of the semiconductor substrate; after forming the metal thin film, forming an ohmic electrode as a first electrode by laser annealing, wherein the laser annealing includes irradiating the metal thin film with laser beam; and after forming the first electrode, dicing the semiconductor substrate into chips by cutting at a dicing region of the semiconductor substrate, wherein: a dicing tape is attached before the dicing, wherein an adhesive layer of the dicing tape is thicker than a level difference between a concave portion in which a laser trace produced in the laser irradiation is formed and a convex portion in which the laser trace is not formed.

By attaching the dicing tape in the above way, the concave and convex portions formed by the presence and absence of the laser trace can be filled with the adhesive layer. By performing the dicing in this state, it is possible to perform the dicing with no influence of the later trace, and it is possible to minimize the occurrence of chipping.

The above manufacturing method of a semiconductor device is preferably applicable to an SiC semiconductor device manufacturing with an SiC semiconductor substrate. Although an annealing of an SiC semiconductor device requires a high temperature, the high temperature of the substrate as a whole may influence an element. Because of this, by performing a local annealing such as the laser annealing and the like, it is possible to make the first electrode the ohmic electrode by a low temperature process and it is possible to minimize the influence on the element.

It should be noted that the above-illustrated respective embodiments, configurations, and aspects do not limit embodiments, configurations, end aspects of the present disclosure. Embodiments, configurations, and aspects obtained by appropriately combining technical parts described in different embodiments, configurations and aspects are also within scope of embodiments, configurations, and aspects of the present disclosure.

What is claimed is:

1. A manufacturing method of a semiconductor device that includes a semiconductor substrate made of a single crystal and having a principal surface and a rear surface opposite to the principal surface, a first electrode provided as an ohmic electrode arranged on the rear surface of the semiconductor substrate, and a second electrode arranged on the principal surface of the semiconductor substrate, the manufacturing method comprising:

preparing a semiconductor substrate made of a single crystal and having a principal surface and a rear surface opposite to the principal surface;

forming a metal thin film on the rear surface of the semiconductor substrate;

after forming the metal thin film, forming an ohmic electrode as a first electrode by laser annealing, wherein the laser annealing includes irradiating the metal thin film with laser beam; and after forming the first electrode, dicing the semiconductor substrate into chips by cutting at a dicing region of the semiconductor substrate, wherein:

in forming the first electrode, the metal thin film is irradiated with the laser beam in at least two non-parallel directions to form multiple laser traces intersecting with each other within each chip, so that multiple convex portions, which are not irradiated with the laser beam and are surrounded by the multiple laser traces, are formed on the metal thin film; and the dicing is performed by cutting the convex portions of the metal thin film.

2. The manufacturing method of the semiconductor device according to claim 1, wherein a silicon carbide substrate is used as the semiconductor substrate.

* * * * *